(12) United States Patent
Kasukawa et al.

(10) Patent No.: US 6,690,701 B2
(45) Date of Patent: Feb. 10, 2004

(54) SEMICONDUCTOR LASER DEVICE

(75) Inventors: Akihiko Kasukawa, Tokyo (JP);
Mikihiro Yokozeki, Tokyo (JP)

(73) Assignee: The Furukawa Electric Co., Ltd.,
Tokyo (JP)

( * ) Notice: Subject to any disclaimer, the term of this patent is extended or adjusted under 35 U.S.C. 154(b) by 0 days.

(21) Appl. No.: 09/733,743

(22) Filed: Dec. 8, 2000

(65) Prior Publication Data
US 2001/0015991 A1 Aug. 23, 2001

(30) Foreign Application Priority Data
Dec. 10, 1999 (JP) .......................................... 11-350966

(51) Int. Cl.$^7$ ................................................. H01S 5/00
(52) U.S. Cl. .......................................... 372/46; 372/50
(58) Field of Search ...................... 372/46, 45

(56) References Cited
U.S. PATENT DOCUMENTS

| | | |
|---|---|---|
| 5,361,271 A | 11/1994 | Takiguchi et al. ............. 372/46 |
| 5,395,792 A | 3/1995 | Ikawa et al. |
| 5,583,881 A * | 12/1996 | Uchida et al. ................. 372/46 |

FOREIGN PATENT DOCUMENTS

| | | | |
|---|---|---|---|
| EP | 0 905 837 A2 A3 | 3/1999 | |
| JP | 02082678 A * | 3/1990 | ................. 372/46 |

* cited by examiner

*Primary Examiner*—Quyen Leung
(74) *Attorney, Agent, or Firm*—Sheppaed Mullin Richter & Hampton LLP

(57) ABSTRACT

A self-aligned type semiconductor laser device which is capable of oscillation at high optical output, scarcely develops COMD, and maintains high reliability for a long term. The SAS type semiconductor laser device has an active layer, and a low refractive-index layer formed close the active layer and functioning also as a current blocking layer. The low refractive-index layer includes a plurality of compound semiconductor layers made of $Al_xGa_{1-x}As$ ($0 \leq x \leq 1$), and the compound semiconductor layers have refractive indices thereof set such that the refractive index lowers with increasing distance from the active layer. Specifically, the low refractive-index layer includes a plurality of AlGaAs layers, and the AlGaAs layers have contents of Al thereof set such that the content of Al increases with increasing distance from the active layer.

19 Claims, 2 Drawing Sheets

SEMICONDUCTOR LASER DEVICE

BACKGROUND OF THE INVENTION

1. Field of the Invention

The present invention relates to a semiconductor laser device having self-aligned structure (SAS type semiconductor laser device), and more particularly, to this type of semiconductor laser device which is capable of high optical output power and also ensures high-reliability operation for a long term.

2. Description of the Related Art

A SAS type semiconductor laser device is a high optical-output laser device capable of simultaneously confining injected current and laser beam within the cavity, and is usually produced using a GaAs-based compound semiconductor.

FIG. 1 shows an exemplary layer structure A of a conventional semiconductor laser device of this type.

As illustrated, on a GaAs substrate 1 of the device are successively formed a buffer layer 2 of n-GaAs with a thickness of 0.5 $\mu$m, a lower cladding layer 3 of n-$Al_{0.3}Ga_{0.7}As$ with a thickness of 2.0 $\mu$m, a lower optical confinement layer 4 of i-$Al_{0.1}Ga_{0.9}As$ with a thickness of 50 nm, an active layer 5 consisting of a quantum well layer of $In_{0.2}Ga_{0.8}As$ with a thickness of 7 nm and a barrier layer of $Al_{0.1}Ga_{0.9}As$ with a thickness of 10 nm, and an upper optical confinement layer 6 of i-$Al_{0.1}Ga_{0.9}As$ with a thickness of 50 nm. Further, an upper cladding layer 7a of p-$Al_{0.3}Ga_{0.7}As$ with a thickness of 500 nm and a low refractive-index layer 8 of n-$Al_{0.35}Ga_{0.65}As$ with a thickness of 0.5 $\mu$m, which serves also as a current blocking layer, are formed on the upper optical confinement layer 6, and these layers are covered with an upper cladding layer 7b of p-$Al_{0.3}Ga_{0.7}As$ with a thickness of 2.0 $\mu$m. On the upper cladding layer 7b, a contact layer 9 of p-GaAs with a thickness of 0.5 $\mu$m is formed. An upper electrode (not shown) is formed on the contact layer 9, and a lower electrode (also not shown) is formed on the opposite side, that is, the lower surface of the substrate 1.

In the illustrated layer structure A, the current blocking layer (low refractive-index layer) 8 has a channel 10 with a predetermined width formed therein as a current injection path continuous with the upper cladding layer 7a, thus forming a light-and-current confinement structure extending across the transverse (width) direction.

The width W of the channel 10, that is, the width of a portion thereof where the electric field distribution is highest within the channel, is determined in conjunction with the transverse mode control for oscillated laser beam. Specifically, in the case of the aforementioned semiconductor laser device of which the upper cladding layer 7a is made of p-$Al_{0.3}Ga_{0.7}As$ and has a thickness of 500 nm or thereabout, the width W of the channel 10 is designed to be about 2.5 $\mu$m in consideration of the cutoff width required to cause the device to operate in fundamental transverse mode while cutting off higher-order mode of laser beam oscillated at the active layer 5.

The device is produced in the following manner.

First, the buffer layer 2, the lower cladding layer 3, the lower optical confinement layer 4, the active layer 5 and the upper optical confinement layer 6 are successively formed on the substrate 1 by MOCVD or MBE. The active layer 5 is made of double $In_{0.2}Ga_{0.8}As$ (7 nm-thick each) quantum wells separated by GaAs (10 nm-thick) barrier, and GaAs (20 nm-thick) optical confinement layers located both sides of quantum wells. Then, after the upper cladding layer 7a of about 500 nm thick is formed on the upper optical confinement layer, a layer 8' as a layer to be formed a low refractive-index layer is formed on the upper cladding layer, thereby obtaining a layer structure $A_0$ shown in FIG. 2.

Subsequently, the layer structure $A_0$ is taken out of the crystal growing apparatus and subjected to photolithography and wet etching to form the channel 10 with a channel width W of 2.5 $\mu$m in the layer 8', thereby obtaining a layer structure $A_1$ (FIG. 3) having the current blocking layer (low refractive-index layer) 8. Side faces 10a of the channel 10 formed by the wet etching are inclined under the influence of etching anisotropy, so that the channel broadens upward.

Then, the layer structure $A_1$ is again placed in the crystal growing apparatus and the upper cladding layer 7b and the contact layer 9 are successively formed on the layer structure $A_1$, thus obtaining a layer structure $A_2$ shown in FIG. 4.

After upper and lower electrodes are formed on the layer structure $A_2$, the structure is cleaved such that it has a cavity length of 800 $\mu$m, thus obtaining the layer structure A shown in FIG. 1. A film with 5% reflectivity is formed on one cleaved face (front facet) $S_1$, while a film with 92% reflectivity is formed on the other cleaved face (rear facet) $S_2$, whereby the intended laser device is obtained.

The laser device produced in the above-described manner has a threshold current of 15 mA and has a maximum optical output, which is limited by kink, of about 350 mW in fundamental mode. The oscillation wavelength is approximately 980 nm.

The above laser device of which the low refractive-index layer 8 has a cutoff width of about 2.5 $\mu$m is associated with the following problems.

If the optical output of the laser device is increased to meet the recent demand for higher optical output, an additional problem arises besides the generation of kink. Specifically, if the laser device is operated at an optical output of about 500 mW, the light density at the front facet $S_1$ increases up to a level of as high as several tens of $MW/cm^2$. Consequently, the front facet $S_1$ is optically damaged, that is, COMD (Catastrophic Optical Mirror Damage) occurs, with the result that the laser device cannot be used thereafter.

A second problem arises because the semiconductor material constituting the low refractive-index layer 8 consists of $Al_{0.35}Ga_{0.65}As$ and has high content of Al in order that the low refractive-index layer 8 may be lower in refractive index than the upper cladding layers 7a and 7b. Specifically, after the layer structure Al is formed, the surface (side faces) of the channel 10 formed in the low refractive-index layer 8 is inevitably exposed to the air before the upper cladding layer 7b is formed thereon, and thus can sometimes be oxidized by the oxygen in the air. If the surface of the channel 10 (low refractive-index layer 8) is oxidized, especially if the side faces of the channel 10 close to the active layer 5 are oxidized, the optical output of the produced laser device lowers in a short period of time when the device is continuously operated, with the result that the device fails to ensure long-term reliability.

SUMMARY OF THE INVENTION

An object of the present invention is to provide a SAS type semiconductor laser device which solves the above problems with SAS type semiconductor laser devices having the layer structure shown in FIG. 1, which scarcely develops COMD even if oscillated at an optical output of as high as 1000 mW or more, and which maintains high reliability for a long term.

To achieve the above object, the present invention provides a SAS type semiconductor laser device having an active layer, and a low refractive-index layer formed close the active layer and functioning also as a current blocking layer, wherein the low refractive-index layer includes a plurality of compound semiconductor layers made of $Al_xGa_{1-x}As$ ($0 \leq x \leq 1$), and the compound semiconductor layers have refractive indices thereof set such that the refractive index lowers with increasing distance from the active layer.

Specifically, in the semiconductor laser device, the compound semiconductor layers have contents of Al thereof set such that the content of Al increases with increasing distance from the active layer.

The present invention also provides a SAS type semiconductor laser device having an active layer, and a low refractive-index layer formed close the active layer and functioning also as a current blocking layer, wherein the low refractive-index layer includes a plurality of compound semiconductor layers made of $Ga_{1-y}In_yAs_zP_{1-z}$ ($0 \leq y \leq 0.5$, $0 \leq z \leq 1$), and the compound semiconductor layers have refractive indices thereof set such that the refractive index lowers with increasing distance from the active layer.

DETAILED DESCRIPTION OF THE INVENTION

Figure 5:
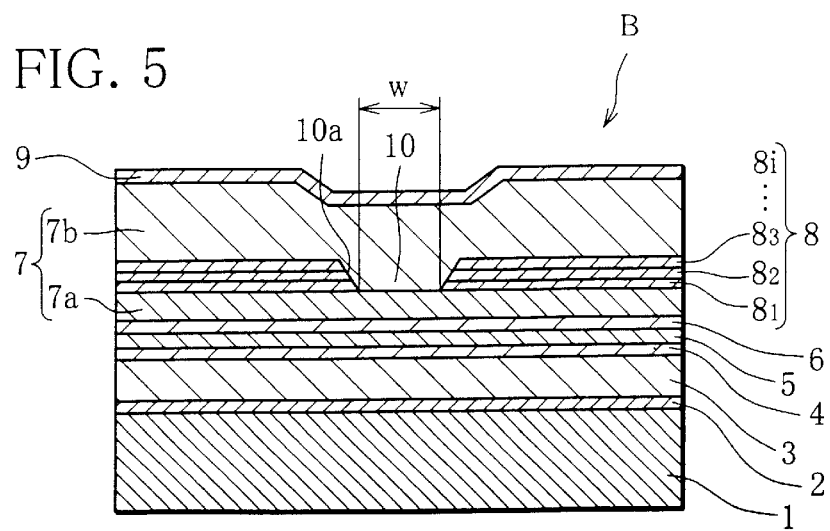
FIG. 5 is a sectional view showing a layer structure B of a laser device according to the present invention.

FIG. 5 illustrates an exemplary layer structure B of a laser device according to the present invention. The layer structure B is identical with the layer structure A shown in FIG. 1, except that the low refractive-index layer 8 is formed in the manner described below.

The low refractive-index layer 8 is constituted by a plurality of layers $8_1$, $8_2$, ..., $8_i$ made of a GaAs-based compound semiconductor material such as AlGaAs or GaInAsP. These layers have refractive indices thereof set such that the refractive index lowers with increasing distance from the active layer 5. Specifically, among the layers constituting the low refractive-index layer 8, the layer $8_1$ formed directly on the upper cladding layer 7a has the highest refractive index, and the refractive index gradually lowers with distance from the upper cladding layer.

Figure 2:
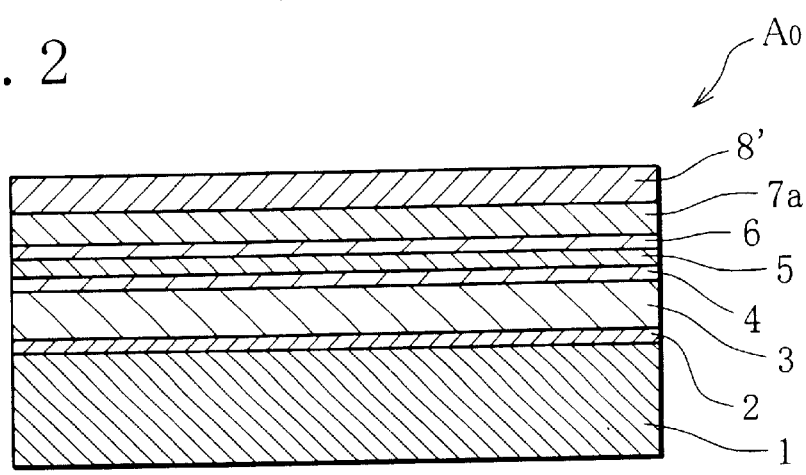
FIG. 2 is a sectional view showing a layer structure $A_0$ in the process of production of the conventional device with the layer structure A shown in FIG. 1.
Figure 3:
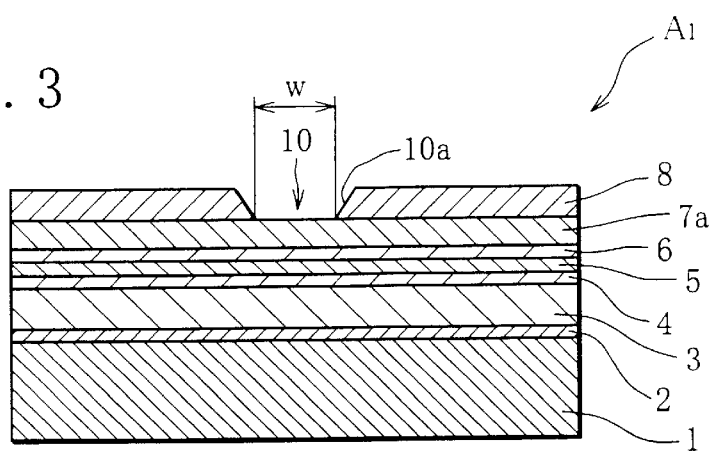
FIG. 3 is a sectional view showing a conventional layer structure $A_1$.

The low refractive-index layer 8 is formed in the same stage as the formation of the layer 8' in the layer structure $A_0$ shown in FIG. 2, by successively forming layers of $Al_xGa_{1-x}As$ ($0 \leq x \leq 1$) with different contents of Al such that the resulting layer 8 has the content of $A_1$ varying in the thickness direction thereof.

More specifically, the layer $8_1$ of n-AlGaAs having a content of Al equal to or smaller than that of the upper cladding layer 7a is formed on the upper cladding layer 7a made of $p\text{-}Al_{0.3}Ga_{0.7}As$, the layer $8_2$ of AlGaAs having a greater content of Al than the layer $8_1$ is formed on the layer $8_1$, the layer $8_3$ of AlGaAs having a greater content of Al than the layer $8_2$ is formed on the layer $8_2$, and so on, so that among the layers thus formed, the content of Al increases stepwise from the bottom upward.

Although in the above low refractive-index layer 8, the content of Al is varied such that it gradually increases step by step as mentioned above, the content of Al may alternatively be varied linearly or parabolically.

The variation in the content of Al in the low refractive-index layer 8 needs to be designed such that the equivalent refractive index (approximated by $\Sigma d_i n_i / \Sigma d_i$, where di is the thickness of each compound semiconductor layer, and ni is the refractive index of each compound semiconductor layer) of the low refractive-index layer 8 as a whole is small, compared with the refractive indices of the upper cladding layers 7a and 7b.

Figure 1:
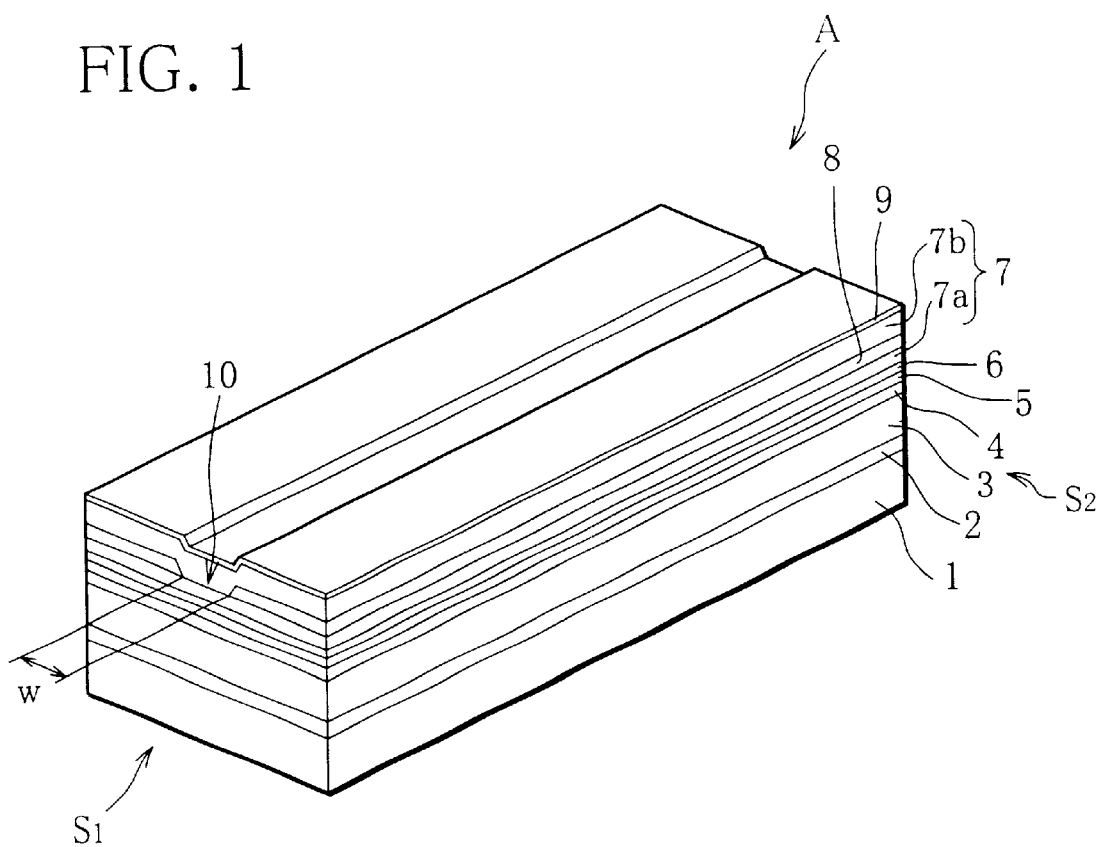
FIG. 1 is a perspective view showing a layer structure A of a conventional SAS type laser device.

Also, the ratio of equivalent refractive index between the channel 10 and the low refractive-index layer 8 is designed to be small, compared with the case of the single low refractive-index layer 8 shown in FIG. 1, whereby fundamental transverse mode operation can be achieved even with an increased width W of the bottom of the channel 10.

With this laser device, therefore, since the cutoff width can be increased compared with the case of the semiconductor laser device of conventional structure shown in FIG. 1, the light density at the front facet is small during oscillation at high optical output and thus COMD scarcely occurs. Conversely, high-output oscillation can be achieved without incurring COMD.

Also, the layers in the vicinity of the bottom of the channel 10 have a small content of Al, compared with the conventional structure, and accordingly, oxidation of the portion close to the bottom of the channel 10, that is, oxidation of the portion close to the active layer, can be suppressed more satisfactorily than in the case of the conventional layer structure A shown in FIG. 1. In other words, it is possible to suppress oxidation of the side face regions of the channel close to the bottom where the electric field distribution is the highest. Accordingly, the laser device can maintain high reliability for a longer term than the conventional structure.

In order to prevent oxidation of the portion of the low refractive-index layer 8 close to the bottom of the channel 10, the lowermost layer of the low refractive-index layer 8 may be formed using GaAs.

In addition, if the equivalent refractive index of the low refractive-index layer 8 is so selected as to be smaller than those of the upper cladding layers 7a and 7b, the low refractive-index layer 8 can be formed using $Ga_{1-y}In_yAs_zP_{1-z}$ ($0 \leq y \leq 0.5$, $0 \leq z \leq 1$), instead of AlGaAs. In this case, since $Ga_{1-y}In_yAs_zP_{1-z}$ contains no Al, the aforementioned oxidation can be suppressed remarkably.

Also in this case, if the ratio of equivalent refractive index between the channel 10 and the other region of the low refractive-index layer 8 than the channel 10 is designed to be small, compared with the case of the single low refractive-index layer 8 shown in FIG. 1, fundamental transverse mode operation can be achieved even with an increased width W of the bottom of the channel 10. Thus, also with this laser device, the cutoff width can be increased compared with the case of the semiconductor laser device of conventional structure shown in FIG. 1. Consequently, the light density at the front facet is small during oscillation at high optical output and thus COMD scarcely occurs. Conversely, high-output oscillation can be achieved without incurring COMD.

EXAMPLES

Figure 4:
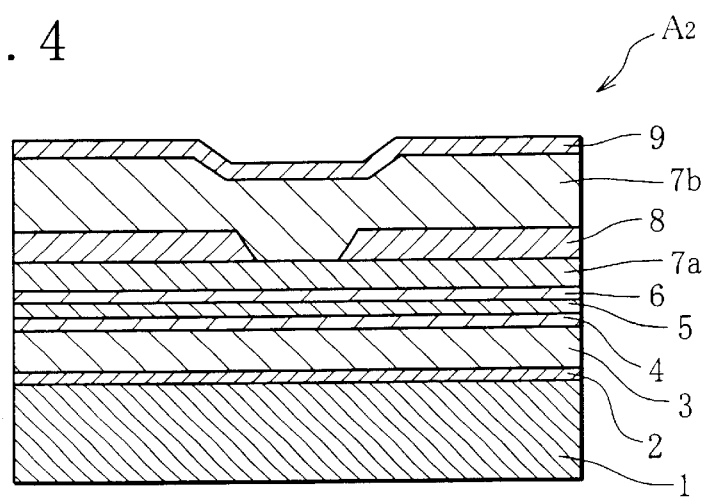
FIG. 4 is a sectional view also showing a conventional layer structure $A_2$.

A layer structure B was formed on a GaAs substrate, the structure B being identical with the layer structure $A_2$ shown in FIG. 4, except that the width W of the channel 10 was 5 μm, and that the low refractive-index layer 8 consisted of five AlGaAs layers successively formed such that their content of Al linearly increased from the bottom upward. Specifically, the lowermost layer $8_1$ had the composition $Al_{0.2}Ga_{0.8}As$ and had a thickness of 0.05 μm (refractive index: 3.536), the layer $8_2$ had a proportion of Al of 0.25 (thickness: 0.05 μm; refractive index: 3.514), the layer $8_3$ had a content of Al of 0.3 (thickness: 0.1 μm; refractive index: 3.493), the layer $8_4$ had a content of Al of 0.35 (thickness: 0.15 μm; refractive index: 3.471), and the uppermost layer $8_5$ had the composition $Al_{0.4}Ga_{0.6}As$ and had a thickness of 0.15 μm (refractive index: 3.450).

The equivalent refractive index $\Sigma d_i n_i / \Sigma d_i$ (di: thickness of each layer; ni: refractive index of each compound semiconductor layer) of the low refractive-index layer 8 was approximated and was found to be 3.48.

After electrodes were formed on the layer structure, the structure was cleaved such that it had a cavity length of 800 μm, and a film with 5% reflectivity and a film with 92% reflectivity were formed on the front and rear facets $S_1$ and $S_2$, respectively, thereby obtaining a laser device.

The laser device had a threshold current of 20 mA and showed a maximum optical output, which is limited by kink, of 500 mW in fundamental transverse mode.

The optical output was further increased and COMD occurred at 1200 mW. By contrast, in the case of a conventional laser device (width at the bottom of the channel: 2.5 μm; single low refractive-index layer) produced using the layer structure $A_2$ shown in FIG. 4, COMD occurred at 500 mW. Accordingly, the laser device of the present invention has remarkably improved performance, as compared with the conventional laser device.

Further, these laser devices were continuously operated under the following conditions: temperature: 60° C.; optical output: 250 mW; and the rate of reduction in the optical output was measured after a lapse of 1000 hours. As a result, the rate of reduction was found to be 0.1 to 0.5% in the case of the laser device according to the present invention, and 1 to 5% in the case of the conventional laser device. This clearly shows that the laser device of the present invention has higher long-term reliability than the conventional laser device.

Also, a semiconductor laser device was produced in the same manner as in the aforementioned example, except that, in the layer structure B of FIG. 5 using a GaAs substrate, the low refractive-index layer 8 had a layer structure described below.

Specifically, the lowermost layer $8_1$ of the low refractive-index layer 8 was formed using GaAs (refractive index: 3.54), then layers were successively formed on the lowermost layer such that their energy gap gradually increased, and the uppermost layer was formed using $Ga_{0.89}In_{0.11}As_{0.78}P_{0.22}$ (refractive index: 3.45).

The semiconductor laser device produced in this manner also showed performance equivalent to that of the aforementioned laser device produced using AlGaAs for the low refractive-index layer.

Further, in this semiconductor laser device, the layers constituting the low refractive-index layer 8 are all Al-free layers containing no Al, and therefore, deterioration of the device attributable to oxidation of the material does not occur.

It is to be noted that the present invention is not limited to the foregoing examples alone, and any desired combination may be employed insofar as the equivalent refractive index of the low refractive-index layer 8 is selected appropriately as described above.

Also, an etching termination layer may be additionally formed between the upper cladding layer 7a and the low refractive-index layer 8 for the purpose of controlling the etching of the low refractive-index layer 8.

As will be clear from the foregoing description, the SAS type laser device according to the present invention is capable of oscillation at high optical output, scarcely develops COMD, and ensures high reliability for a long term. These advantages are achieved by the use of a semiconductor material for the low refractive-index layer having a composition gradient such that the refractive index lowers with increasing distance from the active layer.

What is claimed is:

1. A self-aligned-structure type semiconductor laser device having a substrate, a lower cladding layer disposed above the substrate, an active layer disposed above the lower cladding layer and constructed to generate light having a first wavelength, an upper cladding layer disposed above the active layer, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a plurality of layers made of a compound semiconductor represented by a composition formula:

$Al_xGa_{1-x}As (0<x<1)$ the compound semiconductor layers have refractive indices thereof set such that the refractive indices decrease in value with increasing distance from the active layer, and wherein at least two of the compound semiconductor layers of the low-refractive index layer have bandgap wavelengths which are shorter than the first wavelength.

2. The self-aligned-structure type semiconductor laser device according to claim 1, wherein the compound semiconductor layers have contents of Al thereof set such that the content of Al increases with increasing distance from the active layer.

3. The self-aligned-structure type semiconductor laser device of claim 1 wherein said upper cladding layer has a refractive index, and wherein the low refractive-index layer has an effective refractive index which is less than the refractive index of the upper cladding layer, wherein each compound semiconductor layer of the low refractive-index layer provides a contribution to the effective refractive index, the contribution being equal to the thickness of the compound semiconductor layer multiplied by the refractive index of the compound semiconductor layer ($d_i n_i$), and wherein the effective refractive index is equal to the summation of the contributions of the compound semiconductor layers divided by the summation of the thicknesses of the compound semiconductor layers ($\Sigma_i d_i n_i / \Sigma_i d_i$).

4. The self-aligned-structure type semiconductor laser device of claim 1, wherein the low refractive-index layer includes three or more compound semiconductor sub-layers.

5. The self-aligned-structure type semiconductor laser device of claim 1, wherein at least 30% of the total thickness of the low refractive-index layer comprises aluminum.

6. A self-aligned-structure type semiconductor laser device having a substrate, a lower cladding layer disposed above the substrate, an active layer disposed above the lower cladding layer and constructed to generate light having a first wavelength, an upper cladding layer disposed above the active layer, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a plurality of layers made of a compound semiconductor represented by a composition formula:

$$Ga_{1-y}In_yAs_zP_{1-z}(0<y<0.5,\ 0<z<1),$$

the compound semiconductor layers have refractive indices thereof set such that the refractive indices decrease in value with increasing distance from the active layer, and wherein at least two of the compound semiconductor layers of the low refractive-index layer have bandgap wavelengths which are shorter than the first wavelength.

7. The self-aligned-structure type semiconductor laser device of claim 3 wherein said upper cladding layer has a refractive index, and wherein the low refractive-index layer has an effective refractive index which is less than the refractive index of the upper cladding layer, wherein each compound semiconductor layer of the low refractive-index layer provides a contribution to the effective refractive index, the contribution being equal to the thickness of the compound semiconductor layer multiplied by the refractive index of the compound semiconductor layer ($d_i n_i$), and wherein the effective refractive index is equal to the summation of the contributions of the compound semiconductor layers divided by the summation of the thicknesses of the compound semiconductor layers ($\Sigma_i d_i n_i / \Sigma_i d_i$).

8. The self-aligned-structure type semiconductor laser device of claim 6, wherein the low refractive-index layer includes three or more layers.

9. A self-aligned-structure type semiconductor laser device having a substrate, a lower cladding layer disposed above the substrate, an active layer disposed above the lower cladding layer and constructed to generate light having a first wavelength, an upper cladding layer disposed above the active layer, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a first sub-layer and one or more additional sub-layers, each sub-layer being made of a compound semiconductor represented by a composition formula:

$$Al_xGa_{1-x}As(0<x<1),$$

the sub-layers having refractive indices which decrease in value with increasing distance from the active layer, and wherein the first sub-layer of the low refractive-index layer is closer to the active layer than the one or more additional sub-layers, and wherein the first sub-layer has a bandgap wavelength which is shorter than the first wavelength.

10. The self-aligned-structure type semiconductor laser device of claim 9 wherein said upper cladding layer has a refractive index, and wherein the low refractive-index layer has an effective refractive index which is less than the refractive index of the upper cladding layer, wherein each sub-layer of the low refractive-index layer provides a contribution to the effective refractive index, the contribution being equal to the thickness of the sub-layer multiplied by the refractive index of the sub-layer ($d_i n_i$), and wherein the effective refractive index is equal to the summation of the contributions of the sub-layers divided by the summation of the thicknesses of the sub-layers ($\Sigma_i d_i n_i / \Sigma_i d_i$).

11. The self-aligned-structure type semiconductor laser device of claim 9, wherein the low refractive-index layer includes three or more sub-layers.

12. The self-aligned-structure type semiconductor laser device of claim 9, wherein at least 30% of the total thickness of the low refractive-index layer comprises aluminum.

13. A self-aligned-structure type semiconductor laser device having a substrate, a lower cladding layer disposed above the substrate, an active layer disposed above the lower cladding layer and constructed to generate light having a first wavelength, an upper cladding layer disposed above the active layer, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a first sub-layer and one or more additional sub-layers, each sub-layer being made of a compound semiconductor represented by a composition formula:

$$Ga_{1-y}In_yAs_zP_{1-z}(0<y<0.5,\ 0<z<1),$$

the sub-layers having refractive indices which decrease in value with increasing distance from the active layer, and wherein the first sub-layer of the low refractive-index layer is closer to the active layer than the one or more additional sub-layers, and wherein the first sub-layer has a bandgap wavelength which is shorter than the first wavelength.

14. The self-aligned-structure type semiconductor laser device of claim 13 wherein said upper cladding layer has a refractive index, and wherein the low refractive-index layer has an effective refractive index which is less than the refractive index of the upper cladding layer, wherein each sub-layer of the low refractive-index layer provides a contribution to the effective refractive index, the contribution being equal to the thickness of the sub-layer multiplied by the refractive index of the sub-layer ($d_i n_i$), and wherein the effective refractive index is equal to the summation of the contributions of the sub-layers divided by the summation of the thicknesses of the sub-layers ($\Sigma_i d_i n_i / \Sigma_i d_i$).

15. The self-aligned-structure type semiconductor laser device of claim 13, wherein the low refractive-index layer includes three or more sub-layers.

16. A self-aligned-structure type semiconductor laser device having a substrate, a lower cladding layer disposed above the substrate, an active layer disposed above the lower cladding layer and constructed to generate light, an upper cladding layer disposed above the active layer and having a refractive index, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a plurality of sub-layers made of a compound semiconductor represented by a composition formula:

$$Al_xGa_{1-x}As(0\leq x\leq 1),$$

the sub-layers having refractive indices which decrease in value with increasing distance from the active layer, and wherein the low refractive-index layer has an effective refractive index which is less than the refractive index of the upper cladding layer, wherein each sub-layer of the low refractive-index layer provides a contribution to the effective refractive index, the contribution being equal to the thickness of the sub-layer multiplied by the refractive index of the sub-layer ($d_i n_i$), and wherein the effective refractive index is equal to the summation of the contributions of the sub-layers divided by the summation of the thicknesses of the sub-layers ($\Sigma_i d_i n_i / \Sigma_i d_i$).

17. The self-aligned-structure type semiconductor laser device of claim 16, wherein the low refractive-index layer includes three or more sub-layers.

18. A self-aligned-structure type semiconductor laser device having a substrate, a lower cladding layer disposed above the substrate, an active layer disposed above the lower cladding layer and constructed to generate light, an upper cladding layer disposed above the active layer and having a refractive index, a low refractive-index layer formed close to the active layer and functioning also as a current blocking layer, a resonator cavity in which light is generated, and a first electrode and a second electrode for coupling electrical power to the semiconductor laser device, wherein the low refractive-index layer includes a plurality of sub-layers made of a compound semiconductor represented by a composition formula:

$$Ga_{1-y}In_y As_z P_{1-z} (0<y<0.5, \ 0<z<1),$$

the sub-layers having refractive indices which decrease in value with increasing distance from the active layer, and wherein the low refractive-index layer has an effective refractive index which is less than the refractive index of the upper cladding layer, wherein each sub-layer of the low refractive-index layer provides a contribution to the effective refractive index, the contribution being equal to the thickness of the sub-layer multiplied by the refractive index of the sub-layer ($d_i n_i$), and wherein the effective refractive index is equal to the summation of the contributions of the sub-layers divided by the summation of the thicknesses of the sub-layers ($\Sigma_i d_i n_i / \Sigma_i d_i$).

19. The self-aligned-structure type semiconductor laser device of claim 18, wherein the low refractive-index layer includes three or more layers.

* * * * *